(12) United States Patent
Abu Hilal

(10) Patent No.: US 9,742,423 B1
(45) Date of Patent: Aug. 22, 2017

(54) SEPARATING MOST SIGNIFICANT BITS AND LEAST SIGNIFICANT BITS IN CHARGE STORAGE ELEMENTS OF AN ANALOG-TO-DIGITAL CONVERTER

(71) Applicant: Silicon Laboratories Inc., Austin, TX (US)

(72) Inventor: Obaida Mohammed Khaled Abu Hilal, Singapore (SG)

(73) Assignee: Silicon Laboratories Inc, Austin, TX (US)

( * ) Notice: Subject to any disclaimer, the term of this patent is extended or adjusted under 35 U.S.C. 154(b) by 0 days.

(21) Appl. No.: 15/338,709

(22) Filed: Oct. 31, 2016

(51) Int. Cl.
*H03M 1/12* (2006.01)

(52) U.S. Cl.
CPC ........... *H03M 1/1245* (2013.01); *H03M 1/12* (2013.01)

(58) Field of Classification Search
CPC .............................. H03M 1/1245; H03M 1/12
USPC .................................................. 341/155, 156
See application file for complete search history.

(56) References Cited

U.S. PATENT DOCUMENTS

| | | | |
|---|---|---|---|
| 3,153,142 A | 10/1964 | Hellerman | |
| 4,454,500 A | 6/1984 | Kato et al. | |
| 4,890,095 A | 12/1989 | Esser et al. | |
| 4,947,169 A | 8/1990 | Smith et al. | |
| 6,653,963 B1 | 11/2003 | Barrenscheen et al. | |
| 6,922,164 B1 | 7/2005 | Piasecki et al. | |
| 7,038,609 B1 | 5/2006 | Hurrell | |
| 7,271,758 B2 | 9/2007 | Piasecki et al. | |
| 7,405,689 B2 | 7/2008 | Kernahan et al. | |
| 7,498,962 B2 | 3/2009 | Alfano et al. | |
| 7,515,086 B2 * | 4/2009 | Ryu ......................... | H03M 1/06 341/144 |
| 7,746,262 B2 | 6/2010 | Chowdhury et al. | |
| 7,924,203 B2 * | 4/2011 | Hurrell .................. | H03M 1/145 327/307 |
| 8,633,844 B2 | 1/2014 | Piasecki | |
| 8,717,221 B2 | 5/2014 | Jeon et al. | |
| 9,432,041 B2 | 8/2016 | Giacomini et al. | |
| 9,577,654 B2 | 2/2017 | Kijima et al. | |
| 2007/0115159 A1 * | 5/2007 | Tachibana ........... | H03M 1/1023 341/144 |
| 2010/0271250 A1 | 10/2010 | Barrenscheen et al. | |

OTHER PUBLICATIONS

U.S. Appl. No. 15/338,698, filed Oct. 31, 2016, entitled "Converting Large Input Analog Signals in an Analog-To-Digital Converter Without Input Attenuation," by Obaida Mohammed Khaled Abu Hilal.

(Continued)

*Primary Examiner* — Brian Young
(74) *Attorney, Agent, or Firm* — Trop, Pruner & Hu, P.C.

(57) ABSTRACT

In an example embodiment, an apparatus includes: a first sampling capacitor to switchably couple between an input analog voltage, a reference voltage ($V_{REF}$) and a ground voltage; a second sampling capacitor to switchably couple between the reference voltage and the ground voltage; and a comparator having a first input terminal to couple to the first sampling capacitor and a second input terminal to couple to the second sampling capacitor. The comparator may be configured to compare a voltage level at the second input terminal to a sum voltage based at least in part on the input analog voltage to generate at least one bit of a digital output.

23 Claims, 8 Drawing Sheets

(56) References Cited

OTHER PUBLICATIONS

Silicon Laboratories, "EFM8 Universal Bee Family EFM8UB1 Data Sheet," Date Unknown, 59 pages.
Maxim Integrated, "Tutorial 1080 Understanding SAR ADCS: Their Architecture and Comparison With Other ADCs," Oct. 2, 201, 7 pages.
Silicon Labs Community, "SAR: Successive Approximation Register," Aug. 27, 2014, 9 pages.
Wikipedia, http://en.wikipedia.org/w/index.php?oldid=447467151, "Successive Approximation ADC," data unknown (considered to be prior art), 4 pages.
United States Patent and Trademark Office, Office Action mailed on Apr. 7, 2017, in U.S. Appl. No. 15/338,698.

\* cited by examiner

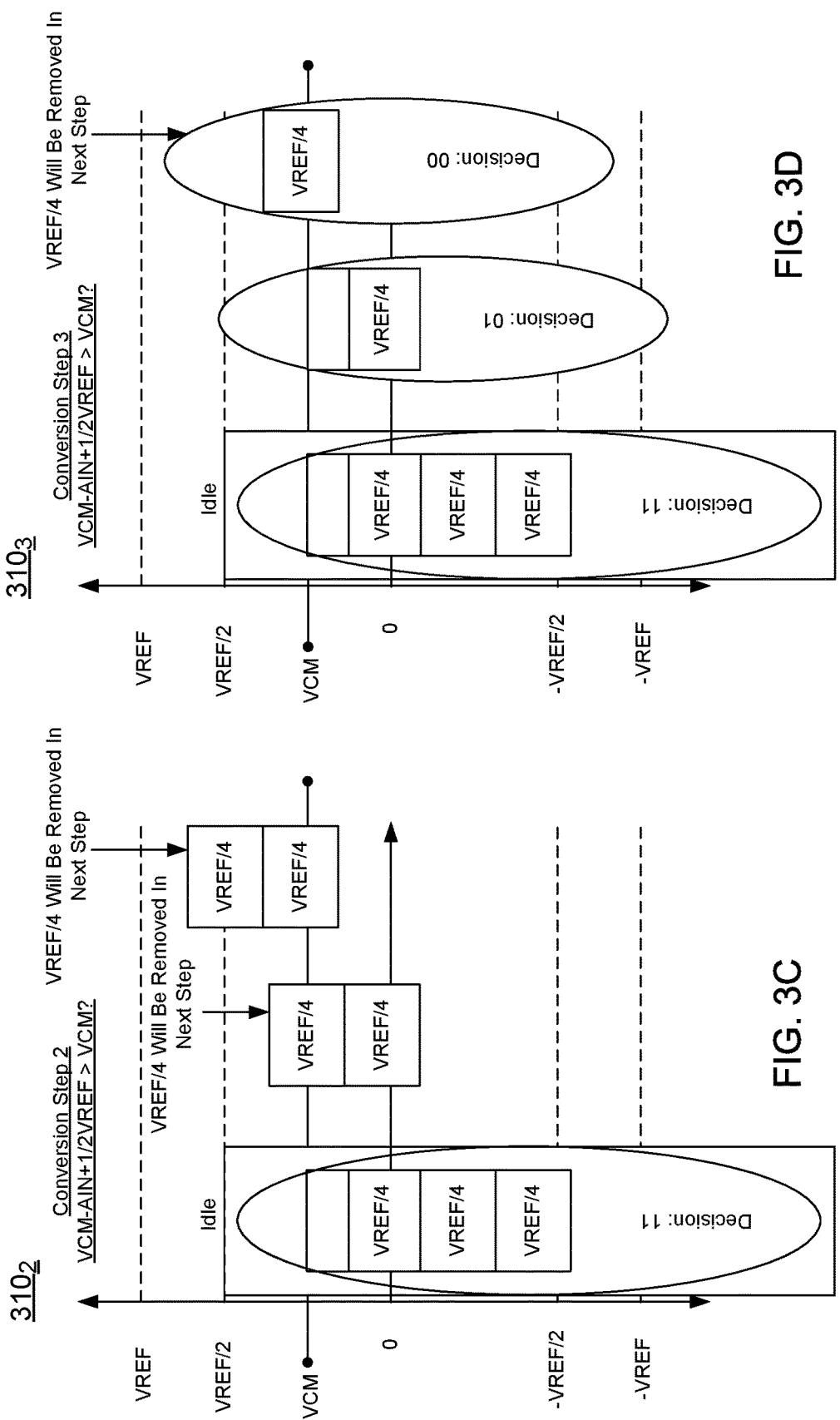

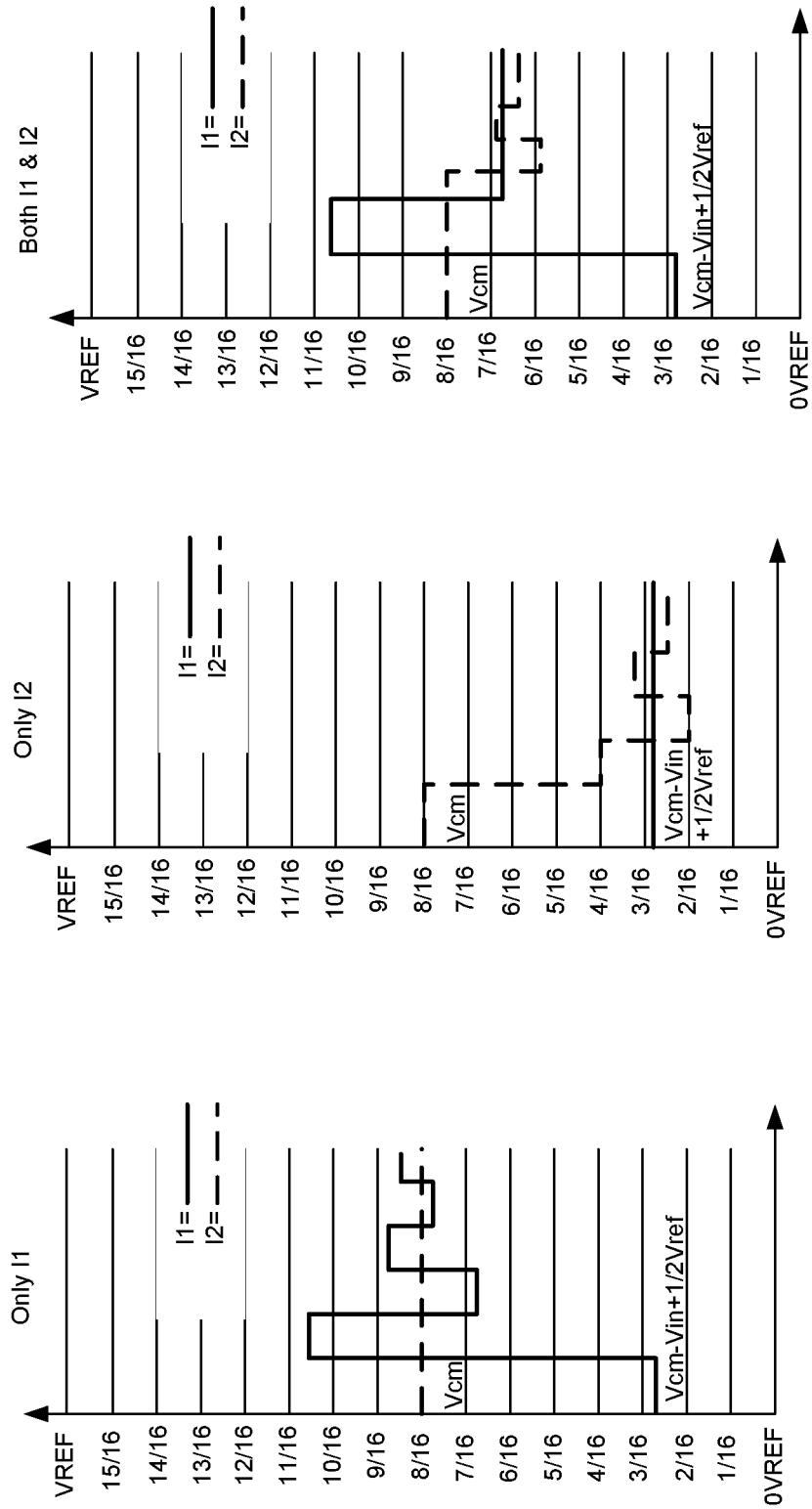

US 9,742,423 B1

SEPARATING MOST SIGNIFICANT BITS AND LEAST SIGNIFICANT BITS IN CHARGE STORAGE ELEMENTS OF AN ANALOG-TO-DIGITAL CONVERTER

BACKGROUND

In many different types of systems, an analog-to-digital converter (ADC) can be used to convert an incoming analog value to a digital value. Such ADCs are useful in many contexts. Specifically, an ADC can be used to read a real world value, namely an analog signal such as a voltage of a given circuit, a temperature, a level of a monitored piece of process equipment or so forth, and convert it to a digital value for use in a control system, as an example.

A number of different types of ADCs exist, including flash ADCs and sigma-delta ADCs. A still further type of ADC is a successive approximation register (SAR) ADC, which compares the input analog signal to a quantization level, and adjust the quantization level in each step to search for a closer level to the input. The SAR ADC usually implements a digital-to-analog converter (DAC) in its feedback loop to generate the quantization level for the comparator, like having a switched capacitor digital-to-analog converter (CDAC). While such ADCs are suitable for many applications, there can be undesirable tradeoffs between accuracy (e.g., number of bits of resolution), speed and power consumption.

SUMMARY OF THE INVENTION

In one aspect, an apparatus includes: a first sampling capacitor to switchably couple between an input analog voltage, a reference voltage ($V_{REF}$) and a ground voltage; a second sampling capacitor to switchably couple between the reference voltage and the ground voltage; and a comparator having a first input terminal to couple to the first sampling capacitor and a second input terminal to couple to the second sampling capacitor, where the comparator is to compare a voltage level at the second input terminal to a sum voltage based at least in part on the input analog voltage to generate at least one bit of a digital output.

In an aspect, a common mode voltage is sampled to the first sampling capacitor and the second sampling capacitor. The sum voltage may be based at least in part on the input analog voltage and a divided reference voltage. The input analog voltage and the reference voltage may be of a first voltage range and the divided reference voltage is according to $$((2^M - 1)V_{REF}/2^M),$$

where M is a number of bits of the digital output to be decided in a thermometer cycle.

In an aspect, the comparator is to operate at a second voltage range, the second voltage range less than $$V_{REF}/2^M.$$

The comparator may determine a plurality of most significant bits (MSBs) of the digital output in one or more first cycles and determine at least one least significant bit (LSB) of the digital output in at least one second cycle.

In an aspect, the apparatus may further include a clamp circuit coupled between the first sampling capacitor and the comparator. The clamp circuit may include a first transistor coupled between the first sampling capacitor and the first input terminal of the comparator, and a second transistor coupled to the second input terminal of the comparator. The comparator may include a plurality of transistors having a breakdown voltage substantially smaller than the first voltage range and the first sampling capacitor includes a first plurality of switching transistors having a breakdown voltage sufficient to support the first voltage range.

In an aspect, the first sampling capacitor is associated with at least a plurality of MSBs of the digital output, and the second sampling capacitor is associated with at least a least significant bit of the digital output. The first sampling capacitor may include a plurality of first capacitors to switchably couple between the first input terminal and a selected one or more of an input node to couple to the input analog voltage, a reference voltage node and a ground voltage node; and the second sampling capacitor may include a plurality of second capacitors to switchably couple between the second input terminal and a selected one or more of the reference voltage node and the ground voltage node.

In an aspect, the second sampling capacitor is further to switchably couple to a divided reference voltage level instead of the reference voltage node, where the divided reference voltage level equals at least a least significant bit voltage of the first sampling capacitor. A unit capacitance of the plurality of first capacitors and a unit capacitance of the plurality of second capacitors may be substantially equal. Switches of the second sampling capacitor may have a smaller breakdown voltage than switches of the first sampling capacitor.

In another aspect, a method includes: sampling an input analog signal via a first sampling capacitor to obtain a sum voltage corresponding to a difference between a common mode voltage and the input analog signal; adding a portion of $V_{REF}$ to the sum voltage to obtain an updated sum voltage; clamping the updated sum voltage to a clamp voltage if the updated sum voltage exceeds a clamp threshold voltage, and outputting a final sum voltage corresponding to the clamp voltage or the updated sum voltage; and comparing the final sum voltage to the common mode voltage and outputting a plurality of bits of a digital output based on the comparison, where the first sampling capacitor is associated with a plurality of most significant bits of the digital output and a second sampling capacitor is associated with one or more least significant bits of the digital output.

In an aspect, the portion of the reference voltage is according to $((2^M-1) \times V_{REF})/2^M$, where M is a number of the plurality of bits of the digital output to be decided in a thermometer cycle. The method may further include outputting the plurality of bits of the digital output having a first value if the final sum voltage is less than the common mode voltage, the first value corresponding to $2^M-1-m$, where m is a value of a first incrementing variable. The method may further include iteratively reducing the final sum voltage by $V_{REF}/2^M$ until the first incrementing variable at least equals $2^M-1$. The method may further include if the final sum voltage exceeds the common mode voltage, reducing the final sum voltage by $V_{REF}/2^M$.

The method may further include clamping the updated sum voltage to the clamp voltage via a clamp circuit coupled between the first sampling capacitor and a comparator, the comparator to compare the final sum voltage to the common mode voltage. The method may further include sampling the input analog signal having a first voltage range and comparing the final sum voltage to the common mode voltage at a second voltage range, the second voltage range less than $1/2^M$ of the first voltage range, where M is a number of the plurality of bits of the digital output to be decided in a thermometer cycle. The method may further include: adding a second portion of $V_{REF}$ to the common mode voltage at the second sampling capacitor to obtain another updated sum voltage, the second portion of $V_{REF}$ being divisions according to $$V_{REF}/2^{BIT},$$

where Bit corresponds to M+1; and comparing the second sampling capacitor sum voltage to the first sampling capacitor sum voltage and outputting at least one least significant bit of the digital output based on the comparison.

BRIEF DESCRIPTION OF THE DRAWINGS

FIGS. 3A-3D are graphical illustrations of performing ADC comparisons using a thermometer-based conversion cycle.

FIGS. 5B-5D are graphical illustrations of control techniques of an ADC in accordance with an embodiment.

DETAILED DESCRIPTION

Figure 1:
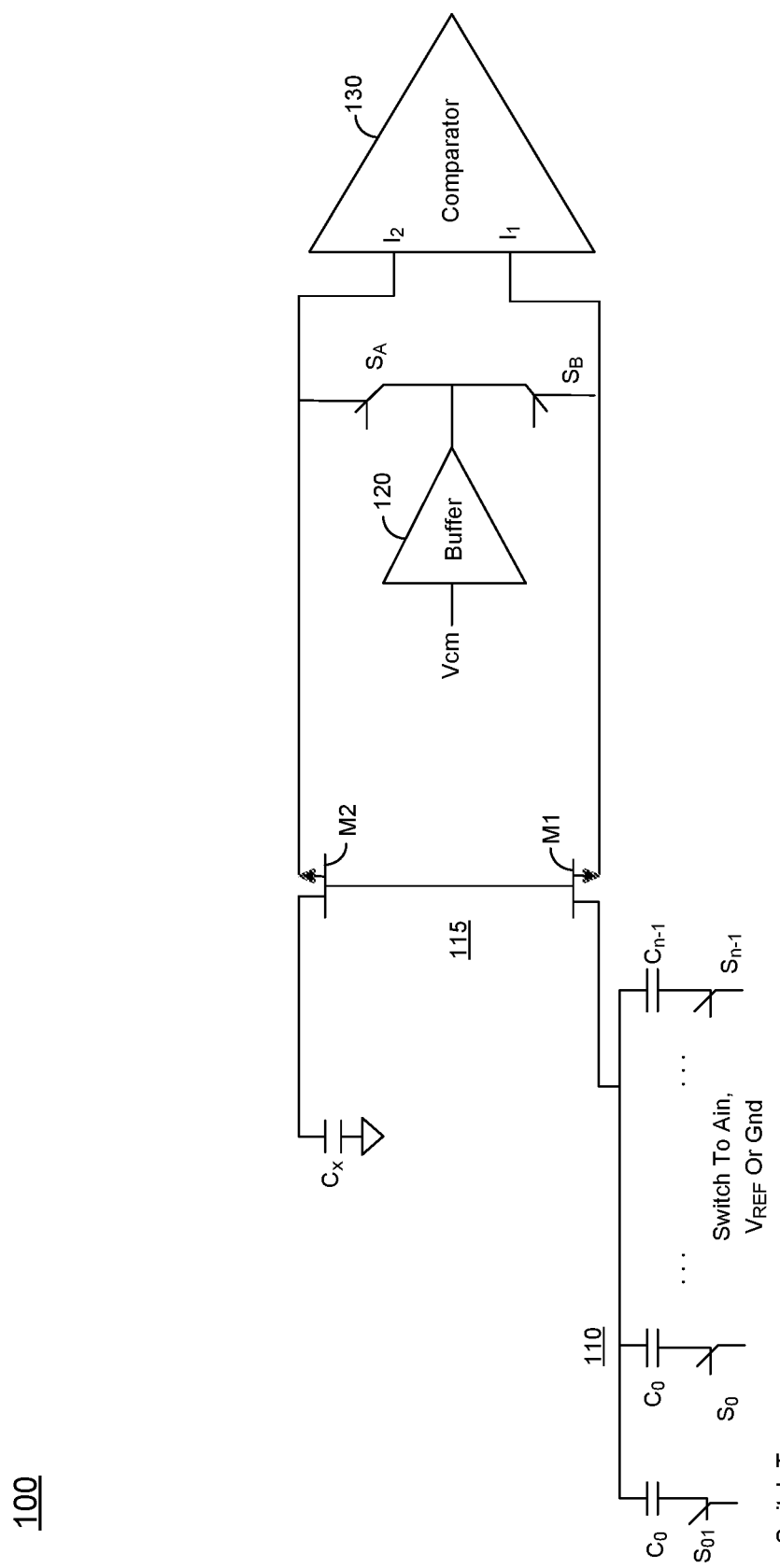
FIG. 1 is a schematic diagram of an ADC in accordance with an embodiment.

Referring now to FIG. 1, shown is a schematic diagram of an ADC in accordance with an embodiment. As illustrated in FIG. 1, ADC 100 is implemented as a SAR ADC having a configuration to realize advantages of and size area among others. To enable incorporation of the ADC into different types of ICs that desirably have smaller area, a design is effected to enable use of transistors within the ADC that operate at lower breakdown voltages than a maximum voltage level of one or more of an incoming analog signal to be converted (e.g., $A_{IN}$) and a reference voltage (e.g., $A_{REF}$).

As illustrated in FIG. 1, ADC 100 includes a comparator 130 configured to compare signals received via a first input terminal $I_1$ and a second input terminal $I_2$, as will be described herein. In embodiments, a given incoming analog voltage can be provided via first input terminal $I_1$ to be compared against another voltage level provided via second input terminal $I_2$. To this end, ADC 100 includes a CDAC 110 that includes a plurality of switchable capacitors $C_0$-$C_{n-1}$. Each capacitor is controllably selectable via control of given switches $S_0$-$S_{n-1}$, which in an embodiment can be implemented as metal oxide semiconductor field effect transistors (MOSFETs). In embodiments these capacitors may be provided with different weighting schemes, e.g., binary weightings, radix weightings, equal weightings or so forth. As will be described herein, these capacitors can be controlled to be selectively switched to a given one of an incoming analog signal ($A_{IN}$), a reference voltage, and/or a ground voltage, depending upon a cycle of the comparison operation.

The voltage level stored on the capacitors of CDAC 110 is provided to first input terminal $I_1$ via a clamp circuit 115 implemented by a pair of MOSFETs M1 and M2, which may be implemented as N-channel MOSFET (NMOS) devices. In different embodiments, other clamp circuits may be used to limit the clamped voltage without consuming current/charge. For example, a buffer circuit with a maximum output/supply may be used. Note that while clamp circuit 115 is provided to limit the incoming voltage to no more than a predetermined level (namely a clamp voltage level that depends on the gate voltage and the threshold voltage of the NMOS devices), understand that such voltage limiting is not an input attenuation, as would be effected by providing resistors or other controllable impedances to attenuate the incoming analog signal, since the input signal is still fully stored in CDAC 110, and no attenuation or loss of charge happens due to the clamping. In addition, the incoming analog signal is not reduced by other means before being provided to ADC 100. Note that clamp circuit 115 only limits the voltage level to a maximum clamp level. Clamp circuit 115 normally passes low voltage input levels exactly with the same value. If the input signal exceeds the clamping limit, the clamp limits the signal on the other side to the clamp level. There is no reduction on the input signal, only limiting which occurs for high voltage levels. If there was any reduction, that would be considered as attenuation.

As illustrated, NMOS M1 has a drain terminal coupled to CDAC 110 and a source terminal coupled to first input node $I_1$, and a gate terminal commonly coupled with NMOS M2, which couples between a dummy capacitor Cx and second input terminal $I_2$. Note that M2 is optional. Since this side is never switched to anything other than a common mode voltage ($V_{CM}$), if $V_{CM}$ is less than the comparator input breakdown voltage, no clamping is needed. Yet it may be included to match both branches. As further illustrated, ADC 100 further includes a buffer 120 configured to provide the common mode voltage ($V_{CM}$) via controllable switching of switches $S_A$ and $S_B$ (which in an embodiment may be implemented as MOSFETs). Up until now, the Cx is not used for any reference switching. If the LSB switching is not done on this side as embodiments detail later, Cx can be sized at any random value. However, it may be sized to be equal to total capacitance of CDAC 110, to cancel the effect of charge sharing due to $S_A$ and $S_B$ switches (any charge leaked by these two switches, should produce an equal voltage on $I_1$ and $I_2$ if both have same capacitance). Another option to reduce area would be to size $S_A$, M2 and Cx to be exact same ratio smaller than $S_B$, M1 and CDAC. However because of process variations, this may add additional random error.

To clarify, comparator 130, $S_A$, $S_B$ and buffer 120 are implemented using lower voltage breakdown transistors, and M1, M2 and switches $S_0$-$S_{n-1}$ are implemented using higher voltage breakdown transistors. That is, in embodiments described herein, CDAC 110 and clamp circuit 115 are implemented using transistors having a high breakdown voltage, e.g., of 5.5 volts, that is higher than or equal to the maximum input analog and reference voltages. Instead, the remaining transistors of ADC 100 may be implemented using transistors that have a much smaller breakdown voltage, e.g., 3.6 volts (or even 1.2 volts if MSB thermo switching described in later embodiments is used), which may significantly reduce both area and circuit delay. This is the case, as using embodiments described herein, voltage levels, both of the incoming analog signal and reference voltages, are limited to proportionally lower values before being provided to the remaining circuitry of the ADC to enable this low voltage operation. Note that these different transistors may be of different sizes and breakdown levels depending on process technology (process allow smaller transistor to be used for lower breakdown levels). With embodiments described herein, understand that transistors having a larger breakdown voltage may be fabricated with thicker oxide layers which increase minimum size of the transistor allowed in the design. As such, by reducing the number of transistors that interact with higher voltages, smaller area and faster circuit (or smaller circuit delay) is realized.

As comparator 130 may be configured to switch at a voltage around the common mode voltage, using a common mode voltage that is smaller than the breakdown voltage of the comparator (plus some margin to account for variations like common mode voltage variations, clamping variations described next, comparator offset and sensitivity variations) and clamping the DAC voltage to that level plus enough margin, reduces the maximum voltage seen by the comparator, e.g., by approximately one half (plus the margin mentioned before). In this way, comparator 130 may use lower breakdown transistors, e.g., 3.6 volts instead of 5.5 volts (thinner transistor which are allowed to be smaller in size) options to realize a smaller comparator area.

Given that CDAC 110 is charge based, clamping can be controlled to be non-leaky for the input, otherwise information stored on CDAC 110 will be lost. Note that because there is no DC path to a supply through transistors M1 and M2 drain and source terminals, no current (or charge) will flow from CDAC 110 (other than possible minor undesired parasitic charge distribution, which can be taken care of by design to be considerably smaller than ADC error). At the same time, transistors M1 and M2 clamp their source voltage (coupled to the comparator input nodes) to their gate voltage minus its $V_{GS}$ (~$V_{TH}$ as $I_D=0_A$), when the input voltage is higher than this limit. Note that the clamp gate voltage ($V_{CLAMP}+V_{TH}$) is designed to be higher than the common mode voltage but lower than the breakdown voltage of thinner transistors of comparator 130, to enable use of thinner transistors in comparator 130. In an embodiment, a maximum common mode voltage can be set at 5.5V/2=2.75V (using a thick clamp transistor with a breakdown voltage of 5.5V). With a thin transistor that has a breakdown voltage of 3.8V, a clamping limit may be set in between these two voltages. Also notice that transistors M1 and M2 may see the largest voltage difference during the conversion process, so their breakdown voltages are as high as the largest input or reference voltage (so usually a thick transistor is used to implement M1 and M2).

Notice that placement of a common mode circuit implemented as buffer 120 and associated switches $S_A$ and $S_B$ at an output of clamp circuit 115 (as they generate a level at common mode only) reduces the SAR area even further, because it allows the use of thin transistors to design the buffer. The common mode buffer may also be placed before M1 and M2 (at the capacitor side), but this will cause the parasitic at the comparator side to have larger effects, and thinner transistors then cannot be used for the design of the common mode buffer, making it larger in area.

Figure 2:
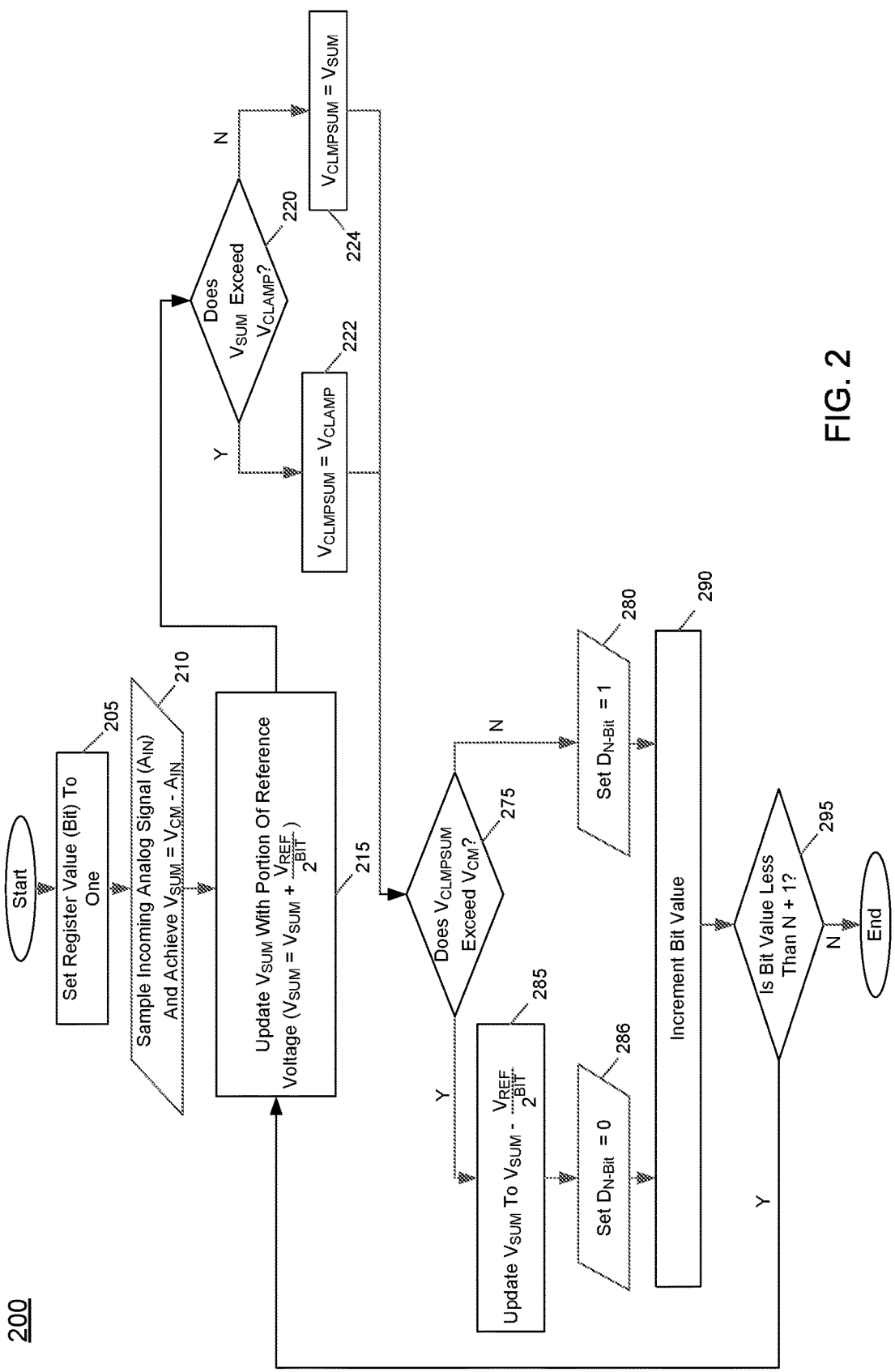
FIG. 2 is a flow diagram of a method for performing ADC operations in accordance with an embodiment.

Referring now to FIG. 2, shown is a flow diagram of a method for performing ADC operations in accordance with an embodiment. More specifically, method 200 details a comparison sequence for a SAR ADC having a clamp circuit as described herein. In the embodiment shown in FIG. 2, method 200 may be used to perform ADC operations according to a binary cycle. As illustrated, method 200 begins by setting a register value (Bit) to one (block 205), wherein this value corresponds to a bit order in a multi-bit decision. At block 210 an incoming analog signal ($A_{IN}$) is sampled. In an embodiment, this sampling may be implemented as a sum between a common mode voltage ($V_{CM}$) and the negative side of the analog input signal $A_{IN}$. To this end, appropriate control of CDAC switches by the ADC may be effected to cause the CDAC to be charged with the analog input signal on one side, along with control of switches of a common mode circuit ($S_B$) to provide a buffered common mode voltage ($V_{CM}$) on the other side of the CDAC, such that the difference or sum voltage ($V_{SUM}=V_{CM}-A_{IN}$) is achieved. Next control passes to block 215 where a portion of a reference voltage is added to this sum voltage. In this first iteration, a reference voltage portion of $V_{REF}/2^{Bit}$ is added.

Control next passes to diamond 220 to determine whether the resulting sum voltage is greater than a clamp voltage ($V_{CLAMP}$). Note that this determination may occur by application of the sum voltage to the drain terminal of the clamp circuit. Based on the comparison, a clamp sum voltage ($V_{CLMPSUM}$) is either set to the sum voltage value or the clamp voltage value (in a given one of blocks 222 and 224). In an embodiment, the clamp voltage may be set to 3.3 volts (thus higher than 5.5V/2=2.75V with some margins). Thus the clamp circuit provides an output via its source terminal that is limited to the clamp voltage value.

In any event, control passes next to diamond 275 to determine whether the clamp sum voltage is greater than the common mode voltage. In an embodiment, this comparison may be performed by the comparator, which thus receives the sum voltage (namely the clamp sum voltage) via a first input terminal and the common mode voltage via a second input terminal. If the clamp sum voltage does not exceed the common mode voltage, control passes to block 280 where a given bit element of the comparator decision, namely $D_{N-Bit}$, is set equal to one. As an example, this element may be set in a temporary storage such as a comparator register coupled to an output of the comparator. In one embodiment, such register may be implemented as a shift register to receive, store and shift incoming bits as the comparator determines the different bits of the decision. Note that in an embodiment, in this first iteration where the bit value equals 1, this decision bit corresponds to the most significant bit (MSB) of the comparator decision. Next the bit value is incremented (block 290) and the operations proceed for a next bit of another binary cycle, until the bit value reaches N+1 (as determined at diamond 295), at which point the N-bit decision is completed.

Note further with regard to FIG. 2, if it is determined at diamond 275 that the clamp sum voltage exceeds the common mode voltage, control instead passes to block 285 where the sum voltage value is updated by subtracting $V_{REF}/2^{Bit}$ from this value. Then the given decision bit ($D_{N-Bit}$) is set equal to zero (at block 286). In this way, method 200 proceeds to generate an N-bit decision in N binary cycles, while ensuring that the voltage provided to the comparator is not greater than the clamp voltage value, enabling smaller-sized transistors to be used within the ADC.

The common mode voltage may be controlled to be substantially at mid-range to ensure that the CDAC voltage even after a maximum step addition $$\left(\frac{V_{REF}}{2}\right)$$

always stays within the supply range. Where a maximum step is reduced, the common md e voltage (which is the maximum voltage after clamping seen by comparator 130) may be reduced also, thus allowing the use of a smaller clamp limit and thus the comparator and common mode circuit to be designed with even thinner transistors (e.g., transistors that break down at 1.4 volts instead of 3.6 volts).

In some embodiments, ADC 100 is controlled to operate in thermo steps as opposed to traditional binary steps for, at least, MSB bits conversion. Instead of covering the reference range by dividing it by two $$\left(\frac{V_{REF}}{2}\right)$$

in a first cycle, CDAC 110 divides the reference range by a larger number ($2^M$, where M is the number of MSB bits in thermo cycle) and uses proper divided steps $$\left(\frac{V_{REF}}{2^M}\right)$$

to scan the reference range.

More specifically, in an embodiment operation begins by adding $$\frac{2^M - 1}{2^M} V_{REF}$$

to the sampled value ($A_{IN}$–$V_{CM}$), and during each thermo cycle CDAC 110 removes a divided step $$\left(\frac{V_{REF}}{2^M}\right)$$

until comparator 130 toggles. In an embodiment in which thermo conversion cycles are used, CDAC 100 may be implemented with unit capacitors having substantially equally sizes, rather than other weighting schemes such as binary or radix schemes (for, at least, MSB bits conversion). In a particular embodiment, the unit capacitance of each of the capacitors of CDAC 100 may be between approximately 1.25 and 2 picoFarads with M=2.

In an embodiment, note that in a thermo cycle M bits are decided (as opposed to one bit in binary cycle); and a number between 1 and $2^M$–1 cycles (as opposed to M cycles) are performed until the conversion is made, as shown in Table 1, which compares the maximum number of cycles for a conversion to finish according to an embodiment to the number of cycles required by a conventional SAR ADC to convert the same number of bits.

TABLE 1

| Number of MSB | SAR | EMBODIMENT | Extra Cycles |
|---|---|---|---|
| 1 MSB | 1 Cycle | 1 Cycle | 0 Cycle |
| 2 MSB | 2 Cycle | 3 Cycle | 1 Cycle |
| 3 MSB | 3 Cycle | 7 Cycle | 4 Cycle |
| M MSB | M Cycle | $2^M$ – 1 Cycle | $2^M$ – M – 1 Cycle |

In an embodiment, the maximum conversion step (and so minimum common mode voltage) for binary step operation is $$\text{MAX}\left(\frac{V_{REF}}{2}\right) = 2.75 \text{ V}$$

(5.5/2 for a 5.5V reference signal). This maximum conversion level may reduce to 1.375V for 2 thermo bits, and to 0.6875V for 3 thermo steps. It can be seen that by converting at least two MSB bits in thermo steps, the common mode voltage can be reduced to be less than 1.4 volts, which allows small transistors that break down at 1.4 volts to be used to design the comparator and the common mode buffer and switches to reduce the circuit area.

In an embodiment, if it is desired to fix the number of cycles for MSB bits conversion in thermo implementation, idle cycles can be added for the rest of the cycles after an early decision is made up to the maximum number of cycles required. Note that while the number of cycles may increase (as compared to binary cycles), the maximum voltage step in the thermo cycle is reduced, resulting in a smaller maximum settling time for the SAR ADC switching. As such, faster cycles can be used, to at least partially compensate for the additional conversion cycles.

Referring now to FIGS. 3A-3D, shown are graphical illustrations of performing ADC comparisons using a thermometer-based conversion cycles. As described herein, such thermo cycles can be used at least for MSBs conversions, to reduce the comparison voltage level and allow use of even smaller transistors within at least portions of the ADC. As illustrated in FIGS. 3A-3D, after a sampling cycle an M-bit set of bits are decided within a given thermometer cycle. In an embodiment, a CDAC structure can be implemented with at least some thermo-based capacitors/switches.

Figures 3A, 3B:
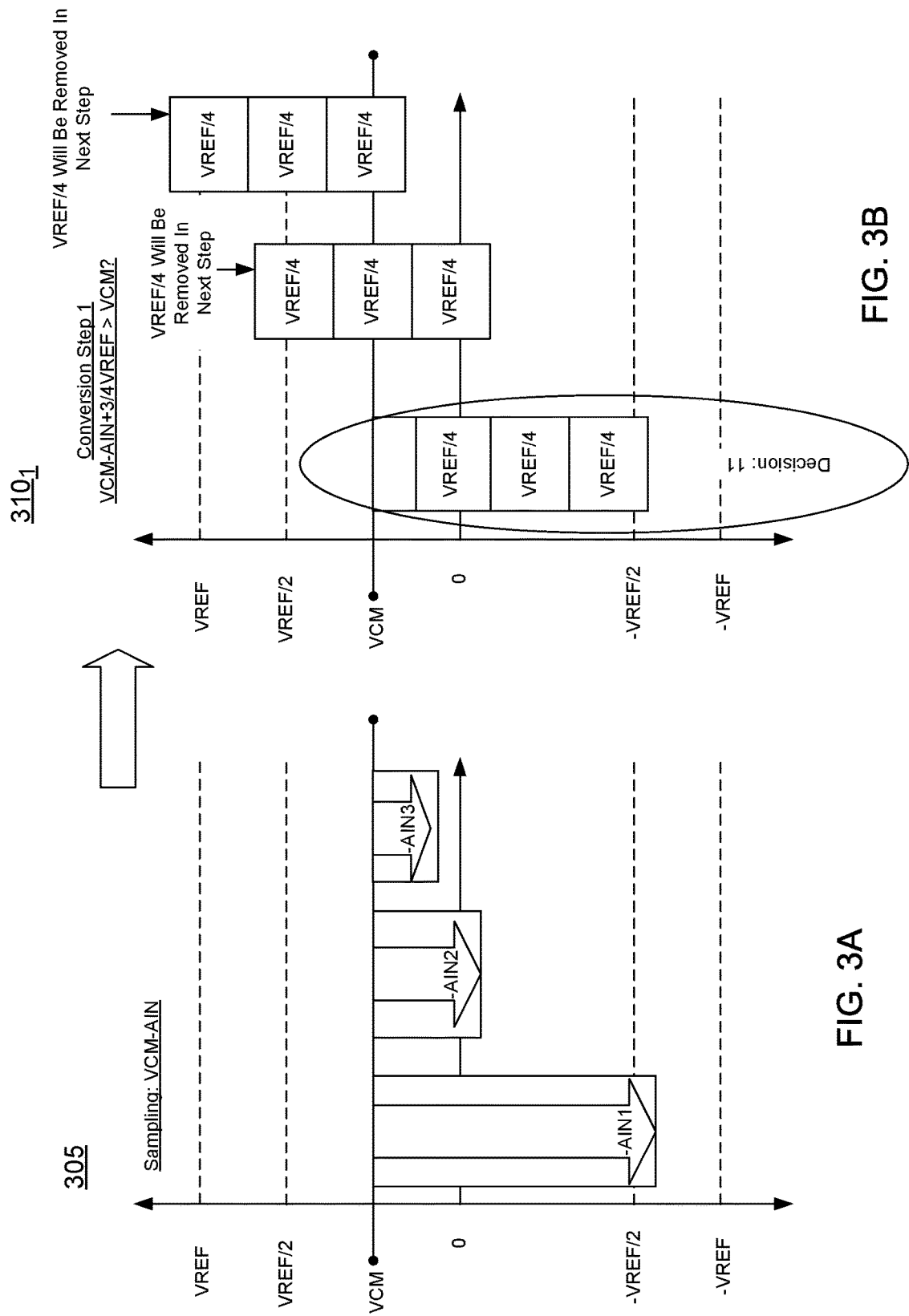

Starting first with FIG. 3A, a sampling cycle 305 occurs in which an incoming analog signal of $A_{IN}$ is subtracted from a common mode voltage of $V_{CM}$. In the illustration of FIG. 3A, note that three different examples are shown, with three different incoming analog signals (AIN1, AIN2, and AIN3), generically AIN) present. In this sampling cycle, sampling with summation occurs by taking the difference of the common mode voltage ($V_{CM}$) with the analog input signal (–$A_{IN}$). In an embodiment, the difference summation occurs by placing the $A_{IN}$ on the farther side of the capacitor, and placing $V_{CM}$ on the comparator side of the capacitor. In an embodiment, for M=2 the common mode voltage may be set to a value less than half of the reference voltage but greater than ¼ of the reference voltage. In an embodiment, note that the reference voltage may be set to a full range of a supply voltage (e.g., 5.5 V) or smaller. In one particular embodiment, the common mode voltage may be set at 1.375 volts.

Note that in the conversion stages shown at steps 310₁-310₃ of FIGS. 3B-3D, given divided values of $V_{REF}$ (after initially adding $3V_{REF}/4$) are subtracted from the sum voltage, reducing the summation voltage by $V_{REF}/4$ each iteration until the summation voltage (namely the clamp sum voltage) is determined to be less than the common mode voltage. Thus as illustrated in FIGS. 3B-3D, multiple thermo cycles may occur to obtain an M-bit set of bits of a decision. More specifically, depending upon the value of the incoming analog signal, a particular 2-bit decision is made within the ADC.

With particular reference to the first conversion step $310_1$ for the first incoming analog signal AIN1, note that after this single conversion step, the sampled voltage is determined to be less than the common mode voltage. As such, a decision for the multiple bits of this analog input signal occurs in this single conversion step, and leads to a decision result of "11."

For the other two input analog signals AIN2 and AIN3, at conversion step $310_1$, the sampled voltage exceeds the common mode voltage. As such, another conversion step occurs in which a portion of the reference voltage, namely $V_{REF}/4$, is removed as shown at conversion step $310_2$ of FIG. 3C. Note also at this step because a decision has already been made for first analog input signal AIN1, it is idle in this step. Also as seen in FIG. 3C, both sampled voltages AIN2 and AIN3 still exceed VCM. As such, operation proceeds for an additional conversion step $310_3$. Here, the second input analog signal (AIN2) leads to a sampled voltage that is less than the common mode voltage and a decision value of "01" is set. As the third analog input signal (AIN3) leads to a sampled voltage that still exceeds the common mode voltage in this third (and final) conversion step $310_3$, a decision value of "00" results.

In an embodiment, the maximum step is reduced to $$V_{REF}/2^M,$$

and the common mode voltage minimum can be reduced to the same (as shown in Equation [1] and [2] below, where $V_{REF}=\text{MAX}(A_{IN})=V_{DD}$ and $\text{MIN}(A_{IN})=V_{SS}$ to allow for maximum voltage range utilization), allowing the use of smaller sized transistors in the comparator and common mode voltage circuits.

$$\text{MAX}\left(V_{CM} - A_{IN} + 3\frac{V_{REF}}{4}\right) \leq V_{DD} \rightarrow \quad [\text{EQ. 1}]$$

$$V_{CM} \leq V_{DD} - 3\frac{V_{REF}}{4} + \text{MIN}(A_{IN}) \rightarrow V_{CM} \leq \frac{V_{DD}}{4}$$

(Where $V_{SS}$ is assumed to be 0, and $V_{REF}$ assumed maximum (equal to $V_{DD}$))

$$\text{MIN}\left(V_{CM} - A_{IN} + 3\frac{V_{REF}}{4}\right) \geq V_{SS} \rightarrow \quad [\text{EQ. 2}]$$

$$V_{CM} \geq V_{SS} - 3\frac{V_{REF}}{4} + \text{MAX}(A_{IN}) \rightarrow V_{CM} \geq \frac{V_{DD}}{4}$$

(Where $V_{SS}$ assumed to be 0, $V_{REF}$ assumed maximum (equal to $V_{DD}$)).

Figure 4:
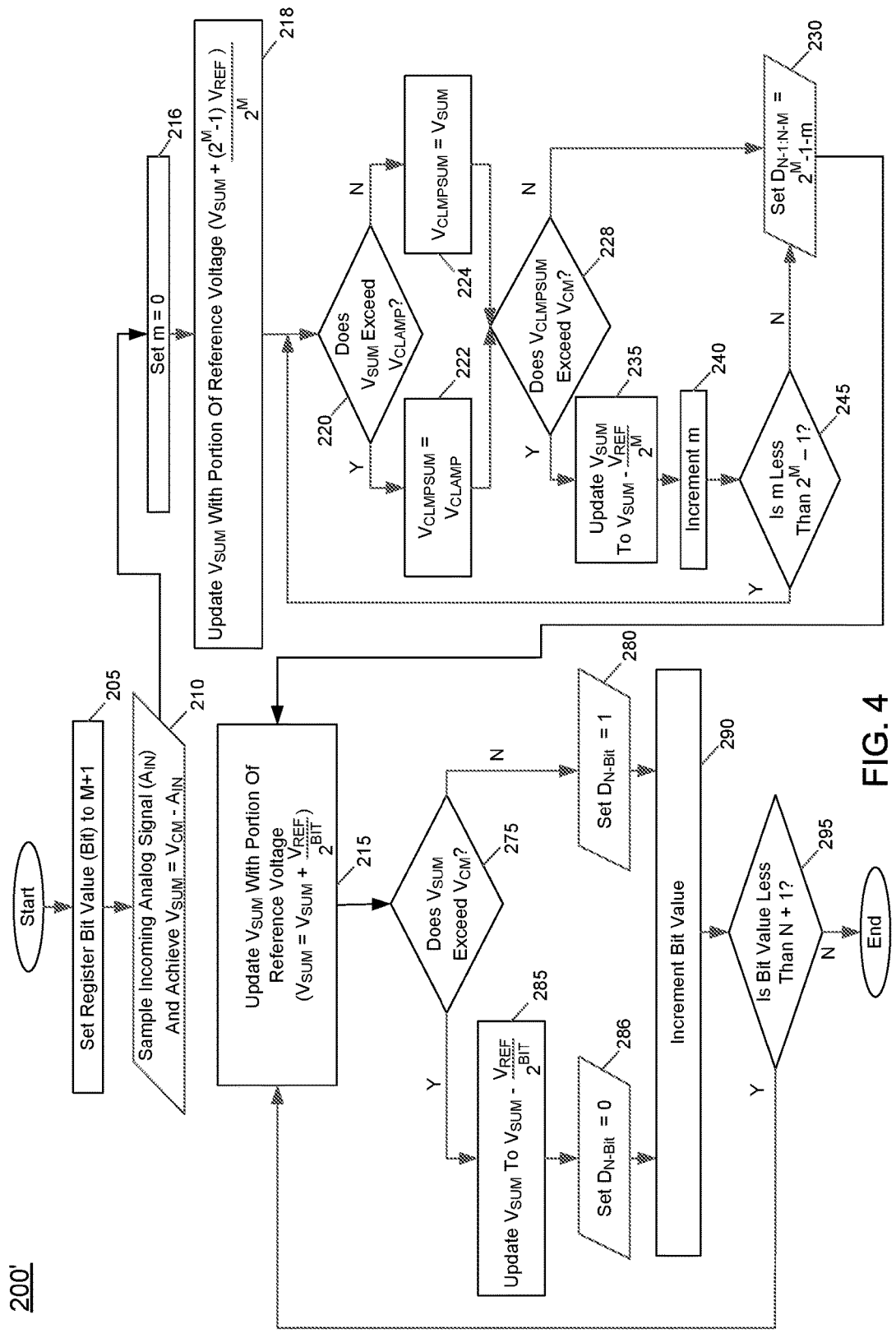
FIG. 4 is a flow diagram of a method for performing ADC operations in accordance with another embodiment.

Referring now to FIG. 4, shown is a flow diagram of a method for performing ADC operations in accordance with another embodiment. More specifically, method 200' details a comparison sequence for a SAR ADC having a clamp circuit and utilizing thermometer cycle-based comparisons as described herein. As illustrated in FIG. 4, method 200' generally proceeds as described above with regard to FIG. 2. However as shown at block 205, the bit value is set equal to M+1. In an embodiment in which M equals 2 (meaning a 2-bit decision is made per thermo cycle), this initial bit value is set at 3. Note also that after the analog input signal is sampled at block 215, additional operations occur to perform the MSB-based thermo cycle comparison. As seen, control next passes to block 216 where a variable, m, is set equal to zero. Next, a portion of a reference voltage (namely $$(2^M - 1)^{V_{REF}}/2^M)$$

is added to the sum voltage (block 218). In an embodiment in which the thermo cycle decides two bits, M is set equal to 2, such that $3 V_{REF}/4$ is added to the sum voltage at block 218. Next, the sum voltage may be clamped as discussed above (shown at diamond 220 and blocks 222/224). Next it is determined at diamond 228, whether the clamp sum voltage value exceeds the common mode voltage. If not, control passes to block 230 where a number of MSBs (namely $D_{N-1:N-M}$ bits) are set equal to the value of $2^M-1-m$, which in an initial iteration is equal to three (11 in binary format). In a representative example, assuming that the ADC is a 12-bit ADC such that N equals 12 and M is two bits, in this instance bits 11:10 are set to one.

Still with reference to FIG. 4, instead if it is determined that the clamp sum voltage exceeds the common mode voltage, control passes to block 235 where the sum voltage is updated, in this instance by subtracting the value of $V_{REF}/2^M$ (which equals $V_{REF}/4$). Next the variable m is updated, e.g., incremented by one at block 240. Next it is tested whether the variable m is less than $2^M-1$ as determined at diamond 245. If not, control passes to block 230 to set the N-1 to N-M MSBs of the decision value with the current value of the variable m (which will be three then, setting bits 11:10 to zero). Otherwise if m is less than $2^M-1$, control passes back to diamond 220.

Still with reference to FIG. 4, after the determination of the N-1 to N-M MSBs at block 230, control passes to block 215. From this point onward, the various operations similar to that described above in FIG. 2 may be performed to determine one or more LSBs of the decision.

A traditional CDAC SAR has capacitance on both comparator ends, such as shown in FIG. 1, where Cx is on one side and CDAC 110 on the other. These capacitors may be implemented with similar values to cancel charge sharing offsets from the common mode switches $S_A$ and $S_B$. Such capacitors may or may not be of same type (even though the same type may be preferred to track design corner-dependent capacitance change). The conventional SAR only switches voltage on CDAC 110, and keeps comparing it with a fixed voltage (the common mode voltage) charged on the other capacitance Cx.

In embodiments, control of comparison voltages provided to the comparator may vary. The sub-reference voltage step can be implemented at either side of the comparator. In some cases, the sub-reference voltage steps may be added/removed by switched using the CDAC that samples difference between the common mode and the input signal (refer to FIG. 5B). In other cases, the sampling CDAC voltage may be fixed and comparison levels are adjusted instead using the CDAC that samples only the common mode voltage (refer to FIG. 5C). A still further option is to adjust both CDACs, not together but only one of them during each cycle (refer to FIG. 5D). If the sampling CDAC performs the MSB conversion cycles and takes care of voltages above the transistor breakdown voltage, embodiments may control other CDACs to perform the LSB conversion cycles, which will only produce voltage levels within a range that is less than the breakdown voltage of small transistors. Since the LSB CDAC needs only to add or remove reference levels equal to or smaller (division) of the least significant bit level of the MSB CDAC (LSB of MSB CDAC) which equals $V_{REF}/2^M$ (where M is the number of bits converted in MSB CDAC), it does not need to switch to $V_{REF}$ and can switch to $V_{REF}/2^M$ instead. Since $V_{REF}/2^M$ may be designed to be less than the small thin transistor breakdown voltage, small breakdown voltage thin transistors may be used to implement the LSB CDAC switching, reducing the CDAC area. In addition, as there is no sampling of input for these LSBs, a switch per LSB bit may be avoided. This will also reduce the number of larger high voltage breakdown switches needed to connect to the input voltage (because the number of capacitors that need to switch to the high voltage input reduces to capacitors in the MSB CDAC only).

Figure 5A:
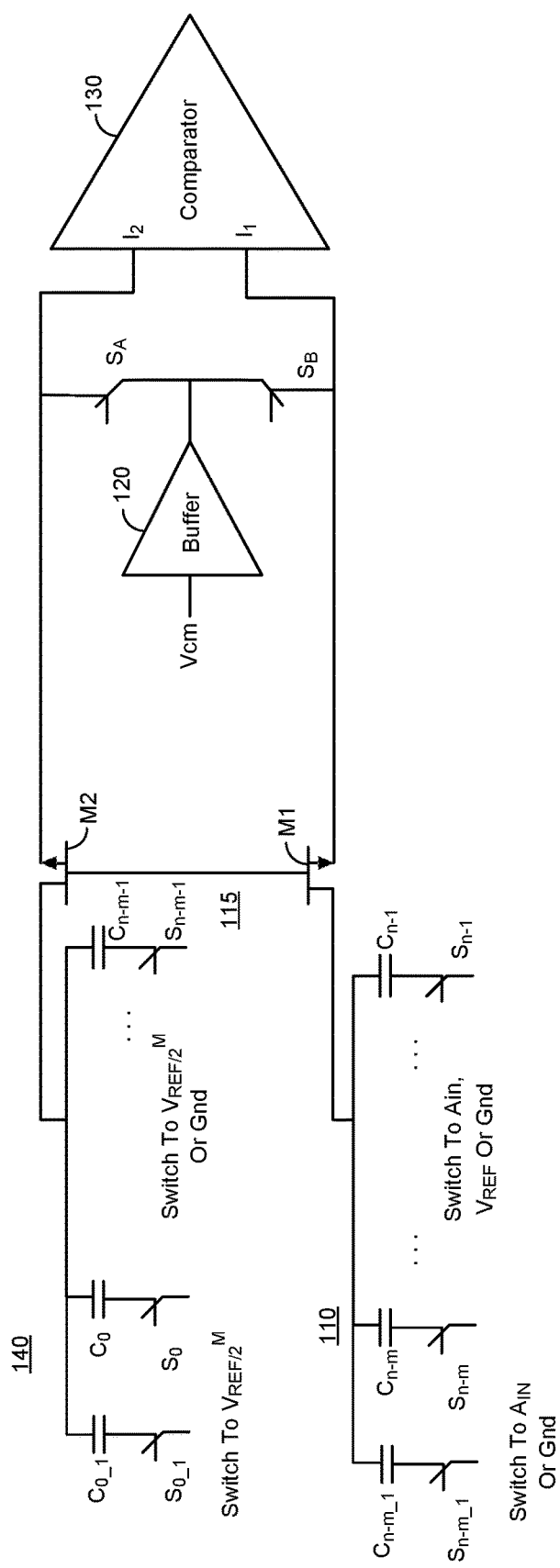
FIG. 5A is a schematic diagram of an ADC in accordance with another embodiment.

Referring now to FIG. 5A, shown is a schematic diagram of an ADC in accordance with another embodiment. As illustrated in FIG. 5A, ADC 100' may be implemented similarly to ADC 100 of FIG. 1, with a CDAC 110, clamp circuit 115, buffer 120 as part of a common mode circuit, and comparator 130. However, note that in the embodiment of FIG. 5A, CDAC 110 includes fewer individual capacitors and switches (same total capacitance value but fewer divisions). More specifically as shown, CDAC 110 may be implemented with a plurality of capacitors $C_{N-1}$-$C_{N-M}$ and corresponding switches $S_{N-1}$-$S_{N-M}$ plus an additional unit capacitor $C_{N-M\_1}$ and switch $S_{N-M\_1}$ (which only connects to analog input and ground) for proper switching ratio. These capacitors may be associated with the MSBs of a digital output of comparator 130. In addition, a separate CDAC 140 is coupled via transistor M2 of clamp circuit 115 to second input terminal $I_2$ of comparator 130. More specifically, CDAC 140 may include one or more capacitors $C_0$-$C_{N-M-1}$ associated with one or more LSBs of the digital output of comparator 130 plus an additional unit capacitor $C_{0\_1}$ and switch $S_{0\_1}$ (which only needs to connect to $V_{REF}/2^M$). Note that in some embodiments, the total capacitance of separate CDACs 110 and 140 may be substantially the same. Having the same capacitance value for CDACs 110 and 140 helps to cancel charge injected from common mode switches $S_A$ and $S_B$. Note further with regard to CDAC 140, it is configured to only switch between $V_{REF}/2^M$ (e.g., $V_{REF}/4$ for M=2) and a ground voltage (and not to the incoming analog signal). As such, the number of transistors or other switches to implement CDAC 140 may be reduced. While FIGS. 1 and 5A show a basic CDAC with binary (and thermo MSB), many other CDAC architectures can be used. For example, an architecture using a bridged capacitor or radix-2 can be used.

The LSB CDAC will move the common mode originally sampled on it down toward the summation voltage (the voltage at MSB CDAC 110). Since the LSB needs to switch to complete at the point where the MSB has stopped, it will switch to steps of $V_{REF}/2^M$ and lower. In order to allow LSB CDAC 140 to switch down $V_{REF}/2^M$ steps or divisions of it, all LSB CDAC 140 switches will switch to $V_{REF}/2^M$ instead of ground during the sampling phase and MSB conversion cycles. When the LSB CDAC 140 wants to switch down, it can switch any combination of switches $S_0$ to $S_{(N-M-1)}$ to ground instead of $V_{REF}/2^M$, which will effectively subtract the reference level ratio of the capacitor from the common mode voltage. The division of $V_{REF}$ to generate $V_{REF}/2^M$ should not affect the total SNR since it will only work on LSB, provided the $V_{REF}/2^M$ was generated with an error smaller than an LSB. The generation of this divided level can be achieved by many means: it can be a separate DAC, a use of a bridge CDAC, or the MSB CDAC can be utilized to generate this level, with a combination of a buffered sample and hold circuit.

In a conventional CDAC SAR, CDAC capacitors are switched between input voltage, reference voltage and ground. If input and reference voltages can go up to high voltages (e.g., 5.5V), all switches would be implemented with high breakdown voltage large transistors, which will also need level shifters to perform the switching control from the logic (logic is placed at low voltage supply as comparator 130). This will not only increase the area, but also possibly increase the time required to switch the transistors due to the level shifter delay, reducing the time margin left for capacitor voltage settling. For the case in FIG. 5A, the LSB side needs only small voltages to control the LSB switches ($S_0$ to $S_{N-M-1}$), eliminating the need for level shifters since control may connect to the comparator successive logic directly. Also even if level shifters are still needed, they can be smaller and faster. This allows switching of the LSB CDAC faster than the MSB CDAC, saving more time during conversion as compared to a conventional CDAC where all steps have to switch to the large voltage, and so will all switch in a slow manner.

It should be noted that the implementation in FIG. 5A increases the value of the unit capacitor for each CDAC without increasing the total capacitance of it. This is because the order of each CDAC is less than the total number of bits N (e.g., MSB CDAC is 4 and LSB CDAC is 12−4=8), but the MSB CDAC will still have to meet the same accuracy as an N-bit CDAC, and the LSB CDAC is desired to match the MSB CDAC total capacitance to cancel charge sharing effect from switches $S_A$ and $S_B$ as described before (though the LSB CDAC needs less total capacitance area since its dividing $V_{REF}/2^M$ not $V_{REF}$, so M-bit division levels has already been accomplished), so the same total value of capacitance is divided by a smaller number of unit capacitors (e.g., $2^4$ and $2^8$ instead of $2^{12}$) without increasing total capacitance. The unit capacitor sizing is very important as it will determine the total area required for each CDAC. It will usually be limited by the minimum mismatching requirement (mismatch translates to noise in the ADC, and so is directly related to the order of the ADC). In an example embodiment such as shown in FIG. 5A, the unit capacitances may be set to between approximately 30 femtoFarads for an 8 bit LSB CDAC, and to 16×30 femtoFarads for a 4 bit MSB CDAC. As such, separating the MSB and LSB CDACs increases the smallest unit capacitor value, which can avoid complex techniques like bridged capacitor (which has floating node and trimming problems).

As discussed above, in different control techniques it is possible to control voltages provided to the comparator from one or both of the CDACs. Referring now to FIGS. 5B-5D, shown are graphical illustrations of control techniques of an ADC in accordance with an embodiment.

As illustrated in FIG. 5B, switching of reference voltage levels by way of a CDAC coupled to a first input terminal of a comparator (namely CDAC 110 coupled to input terminal $I_1$) occurs. In turn, input terminal $I_2$ is configured to receive a fixed common mode voltage $V_{CM}$. Thus in this implementation, $V_{CM}$ is fixed at the 12 input, and $V_{CM}$-$V_{IN}$ is adjusted by different $V_{REF}$ levels controlled by switching of CDAC 110 at input terminal $I_1$.

Referring now to FIG. 5C, an embodiment is shown in which control of the different $V_{REF}$ levels by control of the CDAC coupled to input terminal $I_2$ (namely CDAC 140) occurs. Instead, a fixed value of $V_{CM}$-$V_{IN}$ is provided to input terminal $I_1$ from CDAC 110. Note that in this case, CDAC 140 may benefit from less switches to sample the input signal. However, in such implementation it may not be possible to use lower breakdown voltage thin transistor switches, because the CDAC switches the full reference voltage range $V_{REF}$, and thus it connects to $V_{REF}$, and not $V_{REF}/2^M$.

In yet other embodiments, switching of the inputs to both input terminals of the comparator can occur, as shown in FIG. 5D. As seen, alternate switching of CDAC 110 coupled to input terminal $I_1$ and CDAC 140 coupled to input terminal $I_2$ occurs. Note that in this embodiment, first switching of CDAC 110 occurs to ensure the voltage of that node is less than the clamping voltage (the MSB bits). All other following bits may switch from CDAC 140. Since every bit at the LSB CDAC 140 provides an area savings for switches and required level shifters, the more bits present at CDAC 140, the less area is required. Thus control may switch to CDAC 140 as soon as possible, to save area. Understand while shown with these particular examples in FIGS. 5B-5D, other variations are possible.

In some implementations, an application may have external input attenuation to be able to convert even greater signal levels. For example, while an embodiment enables conversion of signals up to 5.5V using a circuit built mostly from small transistors that break down at 3.6V (or even 1.4V) using embodiments detailed here, a customer or other user may input a 20V signal and attenuate it, e.g., by 4 (20/4=5V) so that a converter as described herein can be used.

Figure 6:
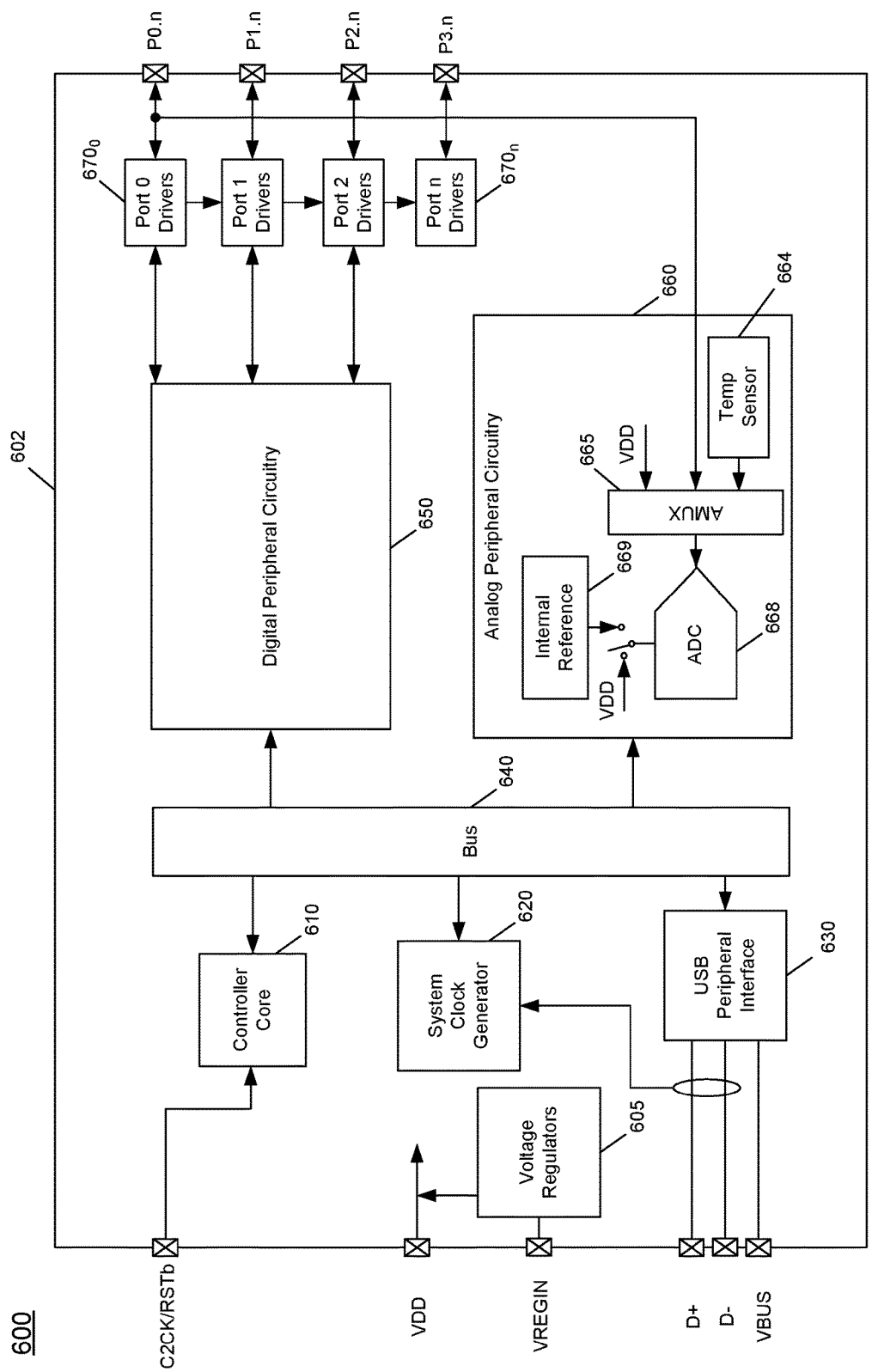
FIG. 6 is a block diagram of a system in accordance with another embodiment.

Referring now to FIG. 6, shown is a block diagram of a system in accordance with an embodiment. As shown in FIG. 6, system 600 includes a microcontroller unit (MCU) 602 with many mixed signal peripherals. While the portion of system 600 shown in FIG. 6 includes only this MCU and a few peripherals, understand that many other system components may be present, including one or more other processors, memories, storage, sensors and so forth, depending upon a particular type of system. In different implementations, such systems may range from relatively small low power devices such as low power interconnected sensors, smartphones, portable digital assistants, to computer systems and so forth. Also in other implementations, it may have less components and peripherals.

As illustrated, MCU 602 includes a controller core 610 which, in embodiments may be implemented as an 8051-based controller. Power is provided within MCU 602 by way of one or more voltage regulators 605. In turn, a system clock generator 620, which may include one or more oscillators, is configured to generate one or more system clocks for use within MCU 602. Also present is a universal serial bus (USB) peripheral interface 630. As illustrated, all of controller core 610, system clock generator 620 and USB peripheral interface 630 are coupled to a bus 640, which in an embodiment may be a given parallel or other type of bus or other interconnect.

In turn, bus 640 couples to digital peripheral circuitry 650. In different embodiments, such digital peripheral circuitry 650 may include interfaces for UARTs, I²C buses, SPI buses and so forth. In turn, digital peripheral circuitry 650 couples to one or more port driver 670₀-670ₙ, each of which may communicate off chip with other devices such as sensors or so forth. In addition, incoming communications also may be provided to analog peripheral circuitry 660.

In embodiments, analog peripheral circuitry 660 may include an ADC 668 as described herein to enable digital conversions to be performed with relatively low power, high bandwidth, and low area consumption. Note that a supply voltage and an internal reference voltage, generated by an internal reference generator 669, may further couple to ADC 668. In addition, a multiplexer 665 provides a selected analog signal, e.g., received from a selected one of ports 670 to ADC 668 to effect a digital conversion. In addition, thermal information may also be another example of analog input by way of one or more temperature sensors 664 as an analog voltage from which a digital value can be generated. Understand the digitized values may be provided to selected destinations, such as controller core 610 or other destinations. Understand while shown at this high level in the embodiment of FIG. 6, many variations and alternatives are possible.

Understand that while the above discussion relates specific embodiments many variations and alternatives are possible. For example, understand that while reference and input signals have been described herein with a voltage swing from a supply to ground, embodiments can be extended to a more general swing of +ve to −ve. In addition, while the concepts described herein have been presented in the context of single-ended circuits, embodiments can also be extended to differential circuits. Also, while the CDAC switching described herein is in the context for a SAR ADC, understand that other ADC architectures, such as a pipeline ADC, may also implement embodiments.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a first sampling capacitor to switchably couple between an input analog voltage, a reference voltage ($V_{REF}$) and a ground voltage;
   a second sampling capacitor to switchably couple between the reference voltage and the ground voltage and not the input analog voltage; and
   a comparator having a first input terminal to couple to the first sampling capacitor and a second input terminal to couple to the second sampling capacitor, wherein the comparator is to compare a voltage level at the second input terminal to a sum voltage based at least in part on the input analog voltage to generate at least one bit of a digital output.

2. The apparatus of claim 1, wherein a common mode voltage is sampled to the first sampling capacitor and the second sampling capacitor.

3. The apparatus of claim 1, wherein the sum voltage is based at least in part on the input analog voltage and a divided reference voltage.

4. The apparatus of claim 3, wherein the input analog voltage and the reference voltage are of a first voltage range and the divided reference voltage is according to $$((2^M - 1)V_{REF}/2^M),$$

wherein M is a number of bits of the digital output to be decided in a thermometer cycle.

5. The apparatus of claim 4, wherein the comparator is to operate at a second voltage range, the second voltage range less than $V_{REF}/2^M$.

6. The apparatus of claim 1, wherein the comparator is to determine a plurality of most significant bits (MSBs) of the digital output in one or more first cycles and determine at least one least significant bit (LSB) of the digital output in at least one second cycle.

7. An apparatus comprising:
a first sampling capacitor to switchably couple between an input analog voltage, a reference voltage ($V_{REF}$) and a ground voltage;
a second sampling capacitor to switchably couple between the reference voltage and the ground voltage;
a comparator having a first input terminal to couple to the first sampling capacitor and a second input terminal to couple to the second sampling capacitor, wherein the comparator is to compare a voltage level at the second input terminal to a sum voltage based at least in part on the input analog voltage to generate at least one bit of a digital output; and
a clamp circuit coupled between the first sampling capacitor and the comparator.

8. The apparatus of claim 7, wherein the clamp circuit comprises a first transistor coupled between the first sampling capacitor and the first input terminal of the comparator.

9. The apparatus of claim 8, wherein the clamp circuit comprises a second transistor coupled to the second input terminal of the comparator.

10. The apparatus of claim 8, wherein the comparator comprises a plurality of transistors having a breakdown voltage substantially smaller than the first voltage range and the first sampling capacitor includes a first plurality of switching transistors having a breakdown voltage sufficient to support the first voltage range.

11. The apparatus of claim 7, wherein the first sampling capacitor is associated with at least a plurality of most significant bits (MSBs) of the digital output, and the second sampling capacitor is associated with at least a least significant bit of the digital output.

12. The apparatus of claim 7, wherein:
the first sampling capacitor comprises a plurality of first capacitors to switchably couple between the first input terminal and a selected one or more of an input node to couple to the input analog voltage, a reference voltage node and a ground voltage node; and
the second sampling capacitor comprises a plurality of second capacitors to switchably couple between the second input terminal and a selected one or more of the reference voltage node and the ground voltage node.

13. The apparatus of claim 12, wherein the second sampling capacitor is further to switchably couple to a divided reference voltage level instead of the reference voltage node, wherein the divided reference voltage level equals at least a least significant bit voltage of the first sampling capacitor.

14. The apparatus of claim 13, wherein a unit capacitance of the plurality of first capacitors and a unit capacitance of the plurality of second capacitors is substantially equal.

15. The apparatus of claim 13, wherein switches of the second sampling capacitor have a smaller breakdown voltage than switches of the first sampling capacitor.

16. A method comprising:
sampling an input analog signal via a first sampling capacitor to obtain a sum voltage corresponding to a difference between a common mode voltage and the input analog signal;
adding a portion of a reference voltage ($V_{REF}$) to the sum voltage to obtain an updated sum voltage;
clamping the updated sum voltage to a clamp voltage if the updated sum voltage exceeds a clamp threshold voltage, and outputting a final sum voltage corresponding to the clamp voltage or the updated sum voltage; and
comparing the final sum voltage to the common mode voltage and outputting a plurality of bits of a digital output based on the comparison, wherein the first sampling capacitor is associated with a plurality of most significant bits of the digital output and a second sampling capacitor is associated with one or more least significant bits of the digital output.

17. The method of claim 16, wherein the portion of the reference voltage is according to $((2^M-1) \times V_{REF})/2^M$, wherein M is a number of the plurality of bits of the digital output to be decided in a thermometer cycle.

18. The method of claim 17, further comprising outputting the plurality of bits of the digital output having a first value if the final sum voltage is less than the common mode voltage, the first value corresponding to $2^M-1-m$, wherein m is a value of a first incrementing variable.

19. The method of claim 18, further comprising iteratively reducing the final sum voltage by $V_{REF}/2^M$ until the first incrementing variable at least equals $2^M-1$.

20. The method of claim 19, further comprising if the final sum voltage exceeds the common mode voltage, reducing the final sum voltage by $V_{REF}/2^M$.

21. The method of claim 16, further comprising clamping the updated sum voltage to the clamp voltage via a clamp circuit coupled between the first sampling capacitor and a comparator, the comparator to compare the final sum voltage to the common mode voltage.

22. The method of claim 16, further comprising sampling the input analog signal having a first voltage range and comparing the final sum voltage to the common mode voltage at a second voltage range, the second voltage range less than $1/2^M$ of the first voltage range, wherein M is a number of the plurality of bits of the digital output to be decided in a thermometer cycle.

23. The method of claim 16, further comprising:
adding a second portion of $V_{REF}$ to the common mode voltage at the second sampling capacitor to obtain another updated sum voltage, the second portion of $V_{REF}$ being divisions according to $V_{REF}/2^{BIT}$, wherein Bit corresponds to M+1; and
comparing the second sampling capacitor sum voltage to the first sampling capacitor sum voltage and outputting at least one least significant bit of the digital output based on the comparison.

* * * * *